United States Patent
Enmoto et al.

(10) Patent No.: US 6,977,336 B2
(45) Date of Patent: Dec. 20, 2005

(54) ELECTRONIC DEVICE

(75) Inventors: Kazuo Enmoto, Tokyo (JP); Masanori Itou, Tokyo (JP); Akihiro Iriguchi, Tokyo (JP); Hiroki Mori, Tokyo (JP)

(73) Assignee: NEC-Mitsubishi Electric Visual Systems Corporation, Tokyo (JP)

( * ) Notice: Subject to any disclaimer, the term of this patent is extended or adjusted under 35 U.S.C. 154(b) by 432 days.

(21) Appl. No.: 09/915,503

(22) Filed: Jul. 27, 2001

(65) Prior Publication Data

US 2002/0079114 A1     Jun. 27, 2002

(30) Foreign Application Priority Data

Dec. 26, 2000    (JP)   ............................ P2000-394790

(51) Int. Cl.[7] .............................................. H05K 9/00
(52) U.S. Cl. ................................. 174/35 GC; 174/35 R
(58) Field of Search ......................... 174/35 R, 35 MS, 174/35 GC; 361/816, 818, 800

(56) References Cited

U.S. PATENT DOCUMENTS

| | | | |
|---|---|---|---|
| 4,803,306 A | | 2/1989 | Malmquist ............. 174/35 GC |
| 5,729,441 A | * | 3/1998 | Murakami .................. 361/818 |
| 6,194,653 B1 | * | 2/2001 | McMiller et al. ...... 174/35 GC |

FOREIGN PATENT DOCUMENTS

| | | |
|---|---|---|
| JP | 6262494 | 4/1987 |
| KR | 20-0147988 | 6/1999 |

* cited by examiner

*Primary Examiner*—Hung V. Ngo
(74) *Attorney, Agent, or Firm*—Birch, Stewart, Kolasch & Birch, LLP

(57) ABSTRACT

A metal foil (10) and a metal plate (1) are used to form an electromagnetic shield for an electronic device. A protrusion (11) is formed on the metal foil (10) by rolling up the edge, and this protrusion (11) is fitted into a hole (30) formed in the metal plate (1). The metal foil (10) is further fixed to the metal plate (1) with screws (80). Thus, it is possible to form the electromagnetic shield for an electronic device at low costs.

10 Claims, 22 Drawing Sheets

ELECTRONIC DEVICE

BACKGROUND OF THE INVENTION

1. Field of the Invention

The present invention relates to an electronic device, and more particularly concerns an improved electronic device in which an electromagnetic shield is realized at low costs.

2. Description of the Background Art

First, an explanation will be given of terms used in the present specification. In the present specification, a metal foil refers to a metal member having such a thickness to be easily bent by a manual job, and a metal plate refers to that having such a thickness to be hardly bent by a manual job.

FIGS. 38 and 39 are exploded assembly drawings that show an inner structure of a conventional electronic device that forms the background of the present invention. This electronic device 150 is designed as a CRT display monitor, and provided with a main body 151 and a case 95. The main body 151 is provided with a CRT 4, electromagnetic shield members 1, 2, 3, 5, 6 and 10, a printed circuit board 14 and a CRT circuit board 15. Each of the electromagnetic shield members 1, 2, 3, 5, 6 and 10 is made of a metal plate of aluminum or iron, and they are connected to each other in such a manner as to surround the CRT 4, the printed circuit board 14 and the CRT circuit board 15, and further electrically grounded. Thus, the electromagnetic shield members 1, 2, 3, 5, 6 and 10 cooperatively function as an electromagnetic shield for suppressing electromagnetic radiation from the CRT 4 and various circuits to the exterior, i.e. for suppressing electromagnetic interference.

The electromagnetic shield members 1, 2, 3, 5, 6 and 10 are respectively referred to as 1: POWER-LEFT, 2: SHIELD-VIDEO, 3: REAR-PLATE, 5: SHIELD-RIGHT, 6: EMS, and 10: TOP-SHIELD. Except for the electromagnetic shield members 2 and 10, the electromagnetic shield members 1, 3, 5 and 6 not only suppress the electromagnetic interference, but also maintain mechanical strength so as to withstand vibration and impact that are imposed as the electronic device 150 is transported.

The printed circuit board 14 on which a video amplifier for amplifying image signals is installed is fixed to the electromagnetic shield member 3 with screws 80. The CRT circuit board 15, which transmits the image signals outputted from the printed circuit board 14 to the CRT 4, is electrically connected to the printed circuit board 14 through braided wires. In FIG. 39, the CRT circuit board 15 is depicted as if it were floating in the air for convenience of explanation; however, actually, a CRT socket, not shown, is attached to the CRT circuit board 15, and during assembling process of the electronic device 150, the CRT socket is inserted into a neck portion of the CRT 4 so that the CRT circuit board 15 is fixed to the CRT 4.

As described above, in the conventional electronic device 150, all the electromagnetic shield members 1, 2, 3, 5, 6 and 10 including the electromagnetic shield members 2 and 10 requiring no mechanical strength have been made of metal plates; therefore, it has the following problems:

First, since screws 80 are used to connect the metal plates to each other, distortion tends to occur at portions in the metal plates fastened by the screws 80, resulting in gaps between the metal plates that are supposed to be connected to each other. In order to prevent these gaps from giving adverse effects on the suppression of electromagnetic interference, it is necessary to narrow the intervals between the portions fastened by the screws 80. Moreover, also in order to implement a desired electrical connection between the metal plates and a sufficient electromagnetic shielding effect, it is necessary to provide a number of fastening portions with screws 80. The resulting problem is that the time required for the screw-fastening job is lengthened, causing high processing costs. Moreover, since a number of screws 80 are required, the material costs also become higher.

Second, in order to reduce the processing costs of the metal plates, it is preferable to carry out the screw fastening process without tapped openings in the metal plate. For this reason, the screw-fastening process is carried out while tapping the metal plate by using the screw 80, with the result that cutting powder from the metal plate tends to fall on the inner circuit of the electronic device 150; consequently, in order to prevent this from causing short-circuiting in the electronic parts, considerable attention or corresponding countermeasures are required.

Third, the electromagnetic shields are generally formed in such a manner as to surround the generation source of electromagnetic waves, and, for example, the electromagnetic shield members 2 and 3 are formed in such a manner as to cooperatively surround the printed circuit board 14 which is a source of electromagnetic waves. For this reason, as illustrated in FIG. 39, the electromagnetic shield member 2 needs to have a complex container shape. In order to provide this shape, complex processes, such as a bending process and a welding process (or a joining process using riveting and caulking jobs), have been required. This also results in high processing costs. In the case of executing the bending process, molds need to be prepared, resulting in a long working time and an increase in the material costs required for the processing. Moreover, prior to transporting the electromagnetic shield member 2 to an assembling site for the electronic device 150, it needs to be subjected to processing such as welding. In comparison with flat metal plates, the electromagnetic shield members 2 after having been processed require higher costs to be transported to the assembling site.

Fourth, in order to improve the electromagnetic shielding effect, generally, it is effective to have a wider area in which the metal plates to be connected are allowed to face each other (or to contact each other) so as to enhance the reflection loss effect of electromagnetic waves; however, this provision needs more materials, resulting in an increase in the material costs.

SUMMARY OF THE INVENTION

It is therefore an object of the present invention to provide an electronic device in which an electromagnetic shield is realized at low costs.

A first aspect of the present invention is directed to an electronic device which comprises an electromagnetic shield, and the electromagnetic shield is provided with a metal foil and a metal plate that are connected to each other. In this arrangement, at a connecting portion of the metal foil and the metal plate, a protrusion, formed by deforming the metal foil along an edge of the metal foil, is fitted into a hole formed along an edge of the metal plate.

In accordance with the first aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, with respect to the connection between the metal foil and the metal plate to form the electromagnetic shield, a protrusion is formed in the metal foil that is easily processed by a manual job, and this protrusion is fitted into a hole formed in the metal plate so that the connection is achieved. For this reason, the connection between the metal foil and the metal plate is sufficiently made easily by a manual job for assembling the metal foil into the electronic device.

A second aspect of the present invention is directed to the electronic device according to the first aspect in which the protrusion is formed by rolling up the edge of the metal foil.

In accordance with the second aspect of the present invention, since the protrusion is formed by rolling up the edge of the metal foil, the protrusion is more easily formed by a manual job.

A third aspect of the present invention is directed to the electronic device according to the first aspect in which the protrusion is formed by bending the edge of the metal foil.

In accordance with the third aspect of the present invention, since the protrusion is formed by bending the edge of the metal foil up, the protrusion is more easily formed by a manual job.

A fourth aspect of the present invention is directed to the electronic device according to claim the first aspect, in which the metal foil and the metal plate are fastened to each other with a screw.

In accordance with the fourth aspect of the present invention, since the metal foil and the metal plate are fastened to each other with a screw at a connecting portion, it is possible to prevent the two members from coming off due to an unexpected event.

A fifth aspect of the present invention is directed to an electronic device which comprises an electromagnetic shield, and the electromagnetic shield is provided with a metal foil and a metal plate that are connected to each other. In this arrangement, at a connecting portion of the metal foil and the metal plate, a protrusion, formed by deforming the metal foil, is formed on the metal foil, and at a position apart from the protrusion in the connecting portion, the metal foil and the metal plate are fastened to each other with a screw so that the protrusion is pressed onto the metal plate.

In accordance with the fifth aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, with respect to the connection between the metal foil and the metal plate to form the electromagnetic shield, a protrusion is formed in the metal foil that is easily processed by a manual job, and the metal foil is fastened to the metal plate with a screw in such a manner as to press this protrusion onto the metal plate so that the connection is achieved. For this reason, the connection between the metal foil and the metal plate is sufficiently made easily by a manual job for assembling the metal foil into the electronic device.

A sixth aspect of the present invention is directed to the electronic device according to the fifth aspect, in which the protrusion is formed by rolling up the edge of the metal foil.

In accordance with the sixth aspect of the present invention, since the protrusion is formed by rolling up the edge of the metal foil, the protrusion is more easily formed by a manual job.

A seventh aspect of the present invention is directed to the electronic device according to the fifth aspect, in which the protrusion is formed by subjecting the metal foil to a drawing process.

In accordance with the seventh aspect of the present invention, since the protrusion is formed by subjecting the metal foil to a drawing process, flat metal foils before being processed can be prepared, and the protrusion can easily be formed by using a simple drawer at a process for assembling the metal foil into the device.

An eighth aspect of the present invention is directed to an electronic device which comprises an electromagnetic shield, and the electromagnetic shield is provided with a metal foil and a metal plate that are connected to each other. In this arrangement, the metal foil is bent in such a manner as to cover an edge of the metal plate, and an area of a pair of main surfaces of the metal plate that is adjacent to the edge is sandwiched in a groove of a frame member together with the metal foil so that the metal foil and the metal plate are fixed to each other.

In accordance with the eighth aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, with respect to the connection between the metal foil and the metal plate to form the electromagnetic shield, the two members are sandwiched by a frame member in the vicinity of the edge of the metal plate so that the connection is achieved. For this reason, an excellent connection between the metal foil and the metal plate can easily be performed by a manual job for assembling the metal foil into the electronic device.

A ninth aspect of the present invention is directed to an electronic device which comprises an electromagnetic shield, and the electromagnetic shield is provided with a metal foil and a metal plate, the metal foil being provided with a recessed section recessed in a shape of a container in a center portion and a flat portion surrounding a periphery thereof in a shape of a flange. In this arrangement, the flat portion faces a main surface of the metal plate.

In accordance with the ninth aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, since the metal foil has a recessed section, a circuit to be shielded is housed between the metal foil and the metal plate. Further, since a flat portion formed on the periphery of the recessed section faces the main surface of the metal plate, the electromagnetic shielding effect is improved.

A tenth aspect of the present invention is directed to the electronic device according to the ninth aspect, in which the recessed section and the flat portion are formed by subjecting a flat metal foil to a drawing process.

In accordance with the tenth aspect of the present invention, since the recessed section and the flat portion are formed by subjecting flat metal foil to a drawing process, flat metal foils before being processed can be prepared, and the recessed section and the flat portion can easily be formed by using a simple drawer at a process for assembling the metal foil into the device.

An eleventh aspect of the present invention is directed to the electronic device according to the ninth aspect, in which the metal foil further comprises an upright portion that is formed by being bent from the flat portion in such a manner as to stand upright along an edge of the flat portion, the upright portion faces an edge of the metal plate.

In accordance with the eleventh aspect of the present invention, since the metal foil has an upright portion formed by bending the flat portion of the metal foil, and since the upright portion faces the edge of the metal plate, it is possible to further improve the electromagnetic shielding effect.

A twelfth aspect of the present invention is directed to an electronic device which comprises an electromagnetic shield, and the electromagnetic shield is provided with a metal foil, the metal foil being provided with a rib formed by bending.

In accordance with the twelfth aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, since a rib is formed in the metal foil, the metal foil can also be provided with a strength that sufficiently maintains its shape. Since the rib is formed by a bending process, it is possible to easily form the rib by a manual job for assembling the metal foil into the electronic device.

A thirteenth aspect of the present invention is directed to electronic device which comprises an electromagnetic shield, and the electromagnetic shield is provided with a metal foil. In this arrangement, the metal foil comprises a hole that is formed by a hand push cutter, with a burr portion being left on a periphery thereof.

In accordance with the thirteenth aspect of the present invention, since metal foil is used as an electromagnetic shield together with a metal plate, the metal plate and the metal foil can properly be arranged at a portion requiring a strength and a portion requiring no strength of the electromagnetic shield to thereby cut material costs and processing costs without causing a reduction in the strength required. Moreover, since holes are formed in the metal foil, the metal foil can be applied to shield a circuit that requires air permeability, such as a power circuit generating heat. Since the holes are formed by using a hand push cutter, the holes can easily be formed by a manual job for assembling the metal foil into the electronic device. Furthermore, since a burr portion is left on the periphery of each of the holes, the hole-forming process is further simplified and air convection is improved, thereby enhancing the air permeability.

A fourteenth aspect of the present invention is directed to an electronic device which comprises an electromagnetic shield, and the electromagnetic shield is provided with a first metal foil and a second metal foil that are connected to each other. In this arrangement, at a connecting portion of the first metal foil and the second metal foil, the first metal foil and the second metal foil are laminated with each other, and fixed to each other with a stapler pin.

In accordance with the fourteenth aspect of the present invention, since metal foils are used as an electromagnetic shield, it becomes possible to cut material costs and processing costs. Moreover, with respect to the connection between the metal foils to form the electromagnetic shield, the metal foils are laminated with each other, and fixed to each other with a stapler pin so that the connection is achieved. For this reason, an excellent connection between the metal foils can easily be performed by a manual job for assembling the metal foil into the electronic device.

A fifteenth aspect of the present invention is directed to an electronic device which comprises an electromagnetic shield, and the electromagnetic shield is provided with a first metal foil and a second metal foil that are connected to each other. In this arrangement, at a connecting portion of the first metal foil and the second metal foil, the first metal foil and the second metal foil are laminated with each other, and fixed to each other by being pinched with by a clip.

In accordance with the fifteenth aspect of the present invention, since metal foils are used as an electromagnetic shield, material costs and processing costs can be reduced. Moreover, with respect to the connection between the metal foils to form the electromagnetic shield, the metal foils are laminated with each other, and fixed to each other by being pinched with clips so that the connection is achieved. For this reason, an excellent connection between the metal foils can easily be performed by a manual job for assembling the metal foil into the electronic device.

A sixteenth aspect of the present invention is directed to the electronic device according to the fourteenth aspect, in which, at the connecting portion, the first metal foil and the second metal foil are overlapped with each other into a triple or more overlapped structure with each other.

In accordance of the sixteenth aspect of the present invention, the metal foils are overlapped on each other into a triple or more overlapped structure with each other; thus, it is possible to further improve the electromagnetic shielding effect. Moreover, the overlapping process of the metal foils can easily be carried out by a manual bending process.

A seventeenth aspect of the present invention is directed to the electronic device according to the fourteenth aspect, in which, each of the first metal foil and the second metal foil comprises a protrusion that is formed by rolling up an end thereof, and located adjacent to the connecting portion.

In accordance with the seventeenth aspect of the present invention, since protrusions are formed adjacent to the connecting portion, it is possible to reduce distortion in the connecting portion, and consequently to improve the electromagnetic shielding effect.

An eighteenth aspect of the present invention is directed to an electronic device which comprises an electromagnetic shield, and the electromagnetic shield is provided with a first metal foil and a second metal foil that are connected to each other. In this arrangement, at a connecting portion of the first metal foil and the second metal foil, the first metal foil and the second metal foil are laminated with each other, and rolled up while being left laminated.

In accordance with the eighteenth aspect of the present invention, since metal foils are used as an electromagnetic shield, it becomes possible to cut material costs and processing costs. Moreover, with respect to the connection between the metal foils to form the electromagnetic shield, the metal foils are laminated with each other, and rolled up in the laminated portion so that the connection is achieved. For this reason, an excellent connection between the metal foils can easily be performed by a manual job for assembling the metal foil into the electronic device.

These and other objects, features, aspects and advantages of the present invention will become more apparent from the following detailed description of the present invention when taken in conjunction with the accompanying drawings.

DESCRIPTION OF THE PREFERRED EMBODIMENTS

Outline of Preferred Embodiments

Figure 1:
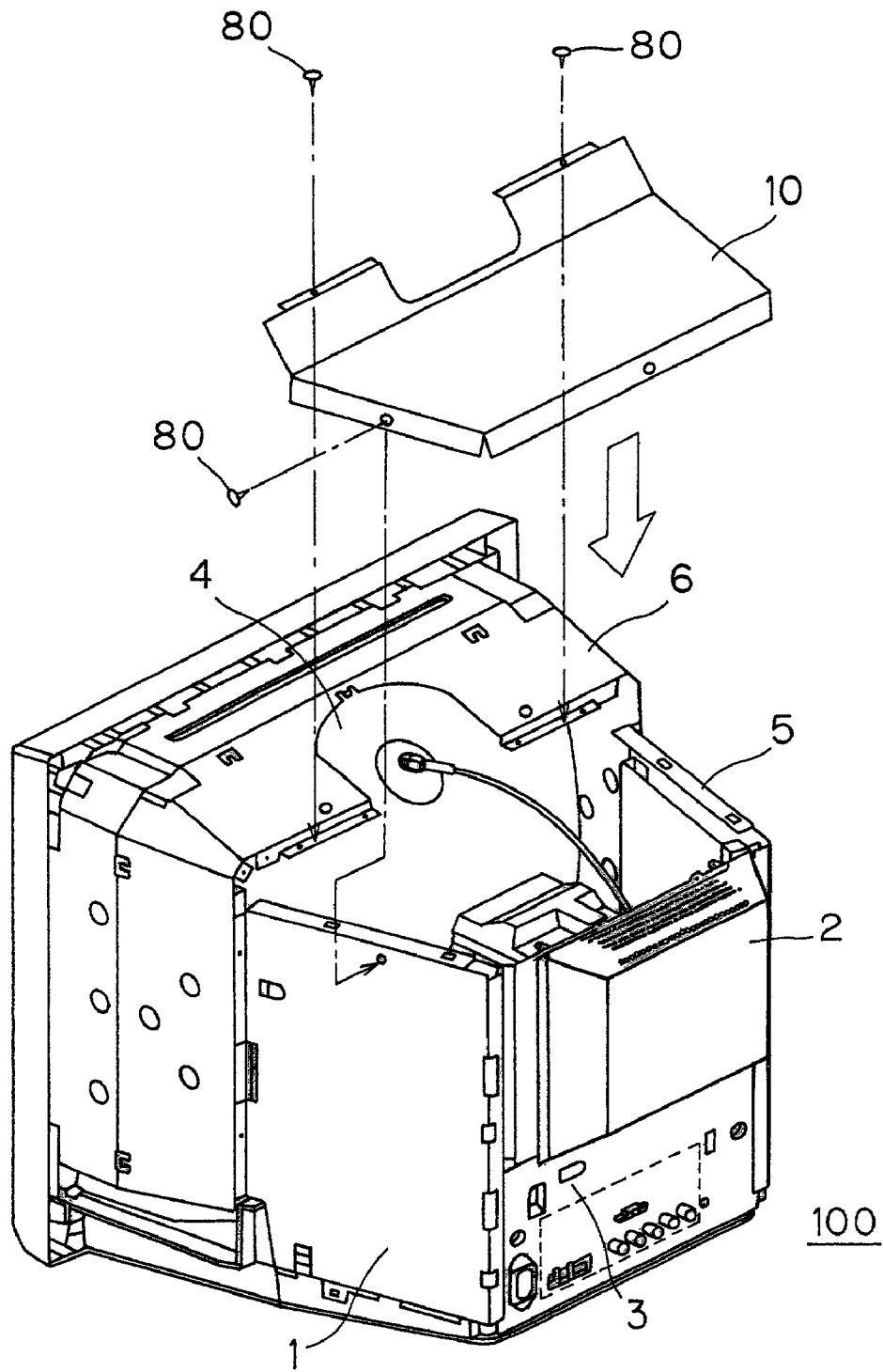
FIG. 1 is an exploded assembly drawing that shows an electronic device in accordance with respective preferred embodiments.
Figure 38:
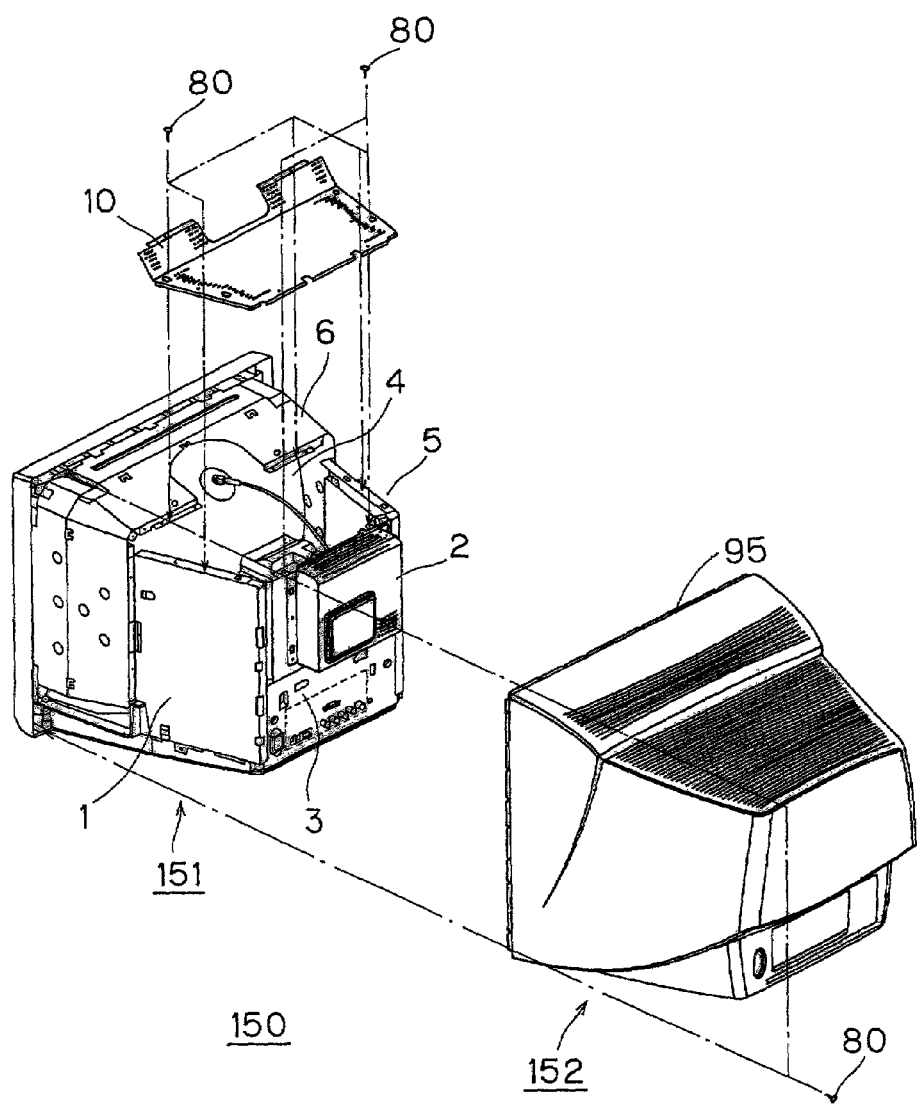
FIGS. 38 and 39 are exploded assembly drawings of a conventional electronic device.
Figure 39:
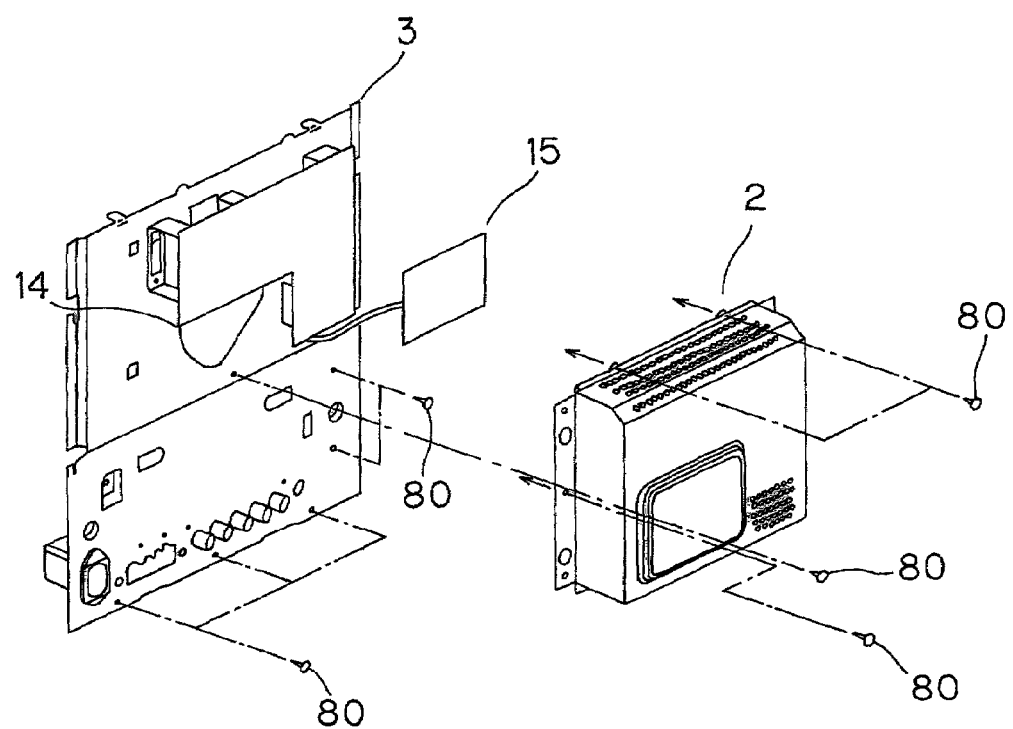

FIG. 1 is an exploded assembly drawing that shows an inner structure of an electronic device in accordance with preferred embodiments of the present invention, which will be described below. In the following figures including FIG. 1, those parts that are the same as or corresponding to (having the same functions as) those of the conventional electronic device 150 shown in FIGS. 38 and 39 are indicated by the same reference numbers so as to clarify their correlation, and the detailed description thereof is omitted.

In the same manner as the electronic device 150, an electronic device 100, shown in FIG. 1, is designed as a CRT display monitor; however, this device is characteristically distinct from the electronic device 150 in that the electromagnetic shields 2 and 10 requiring no mechanical strength are made of metal foil. This metal foil is, for example, aluminum foil that is superior in conductivity, less susceptible to corrosion and available at low costs. Among the electromagnetic shield members 1, 2, 3, 5, 6 and 10, with respect to the electromagnetic shield members 1, 3, 5 and 6 except for the electromagnetic shields 2 and 10 are made of metal plates in the same manner as the conventional electronic device 150. In the electronic device 100, since the metal foil is used as the electromagnetic shield members 2 and 10, it is possible to cut material costs and processing costs without causing a reduction in the strength required.

Among the following preferred embodiments, in the first to fourth and eighth preferred embodiments, an explanation will be given of a specific configuration of a connecting portion between a metal plate and metal foil that are included in an electromagnetic shield of the electronic device 100. Moreover, in the first, second, fifth and sixth preferred embodiments, an explanation will be given of a specific shape of the connecting portion. Moreover, in the seventh preferred embodiment, an explanation will be given of a specific configuration of connecting portions between a plurality of metal foils that are included in the electromagnetic shield.

First Preferred Embodiment

Figure 2:
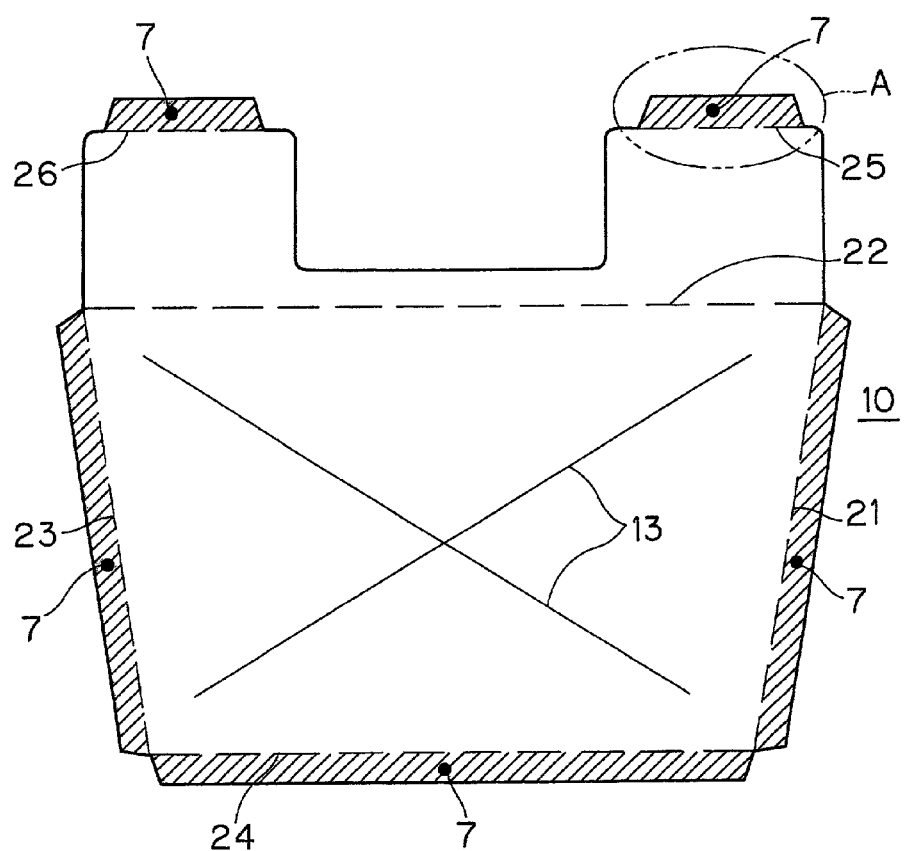
FIG. 2 is a development that shows an electromagnetic shielding member in accordance with a first preferred embodiment.

FIG. 2 is a development showing an electromagnetic shield member 10. In this electromagnetic shield member 10, a flat metal foil before being processed is subjected to a bending process along bent lines 21 to 26. In FIG. 2, hatched portions correspond to connecting portions that are to be connected to the electromagnetic shield members 1, 3, 5 and 6 that are formed of metal plates and adjacent thereto. In portions 7, these connecting portions are fastened onto the electromagnetic shield members 1, 3, 5 and 6 by screws 80 (FIG. 1).

Figure 3:
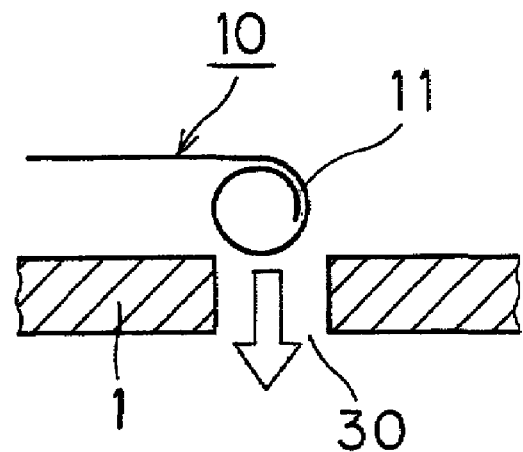
FIGS. 3 and 4 are drawings that show a sequence of connecting processes of the member of FIG. 2.
Figure 4:
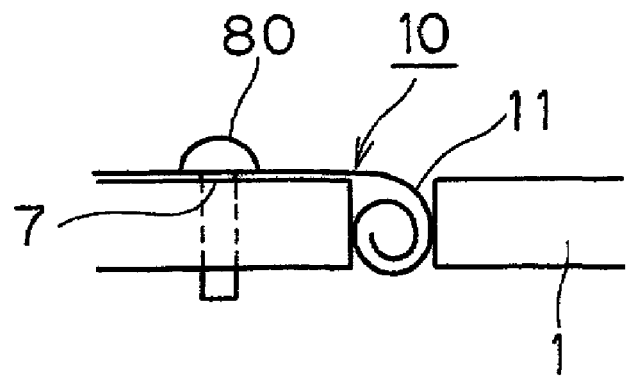

As illustrated in the cross-sectional view of FIG. 3, in the connecting portion of the electromagnetic shield member 10, a protrusion 11 is formed along the edge of the electromagnetic shield member 10, and this protrusion 11 is fitted into a hole 30 that is formed in advance, for example, in the electromagnetic shield member 1. The electromagnetic shield member 10, shown in FIG. 3, corresponds to, for example, a portion surrounded by a circle A of FIG. 2. The protrusion 11 is easily formed by rolling the edge of the electromagnetic shield member 10 made of the metal foil into a cylinder shape, etc., by a manual job and an automatic processing job. Thereafter, as illustrated in the cross-sectional view of FIG. 4, the electromagnetic shield members 1 and 10 are fastened to each other with screws 80.

Figure 5:
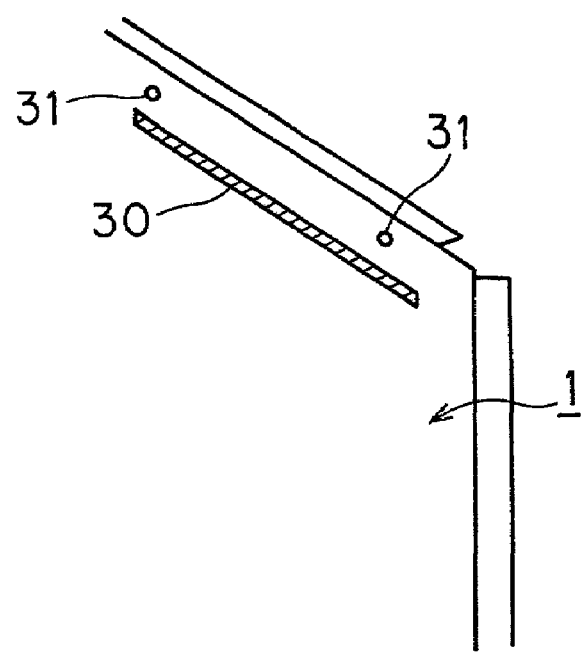
FIG. 5 is a perspective view that shows an electromagnetic shield member to which the member of FIG. 2 is connected.
Figure 6:
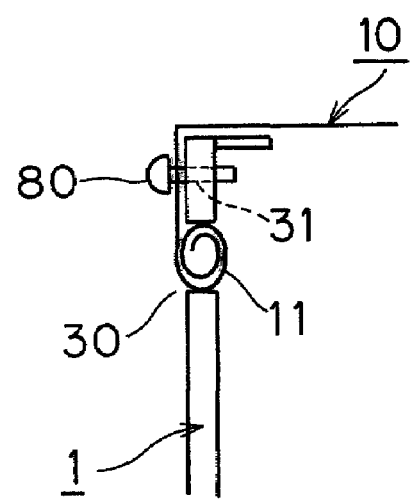
FIG. 6 is a cross-sectional view that shows a connecting portion between the member of FIG. 2 and the member of FIG. 5.

As illustrated in the perspective view of FIG. 5, the hole 30 for receiving the protrusion 11 is formed into an elongated shape along the edge in the connecting portion between the electromagnetic shield member 1 and the electromagnetic shield member 10. A screw hole 31 for receiving the screw 80 is formed between the edge of the electromagnetic shield member 1 and the hole 30. As illustrated in the cross-sectional view of FIG. 6, after the protrusion 11 has been fitted into the hole 30, the screw 80 is inserted into the screw hole 31, and fastened by the screw.

Since the protrusion 11 is fitted into the hole 30, the electrical connection between the electromagnetic shield members 1 and 10 is desirably made not only by a point contact of the fastening portion of the screw 80, but also by a linear contact with a wider width. Consequently, leakage of electromagnetic waves is suppressed, and the effects of the electromagnetic shield are consequently improved. Moreover, since the protrusion 11 is formed, it is possible to increase the mechanical strength of the electromagnetic shield member 10, and consequently to reduce distortion such as twisting of the member.

Since the electrical linear contact is achieved between the protrusion 11 and the hole 30, it is possible to reduce the number of portions 7 to be fastened by using the screws 80 without causing a reduction in the electromagnetic shielding effect, as illustrated in FIGS. 2 and 5. Moreover, the electromagnetic shield member 10 is easily processed and formed by a manual job from a flat metal foil. For this reason, with respect to the material for the electromagnetic shield member 10, flat metal foils before being processed can be carried into an assembling site of the electronic device 100, and these are processed into the electromagnetic shield member 10 at the assembling site. Moreover, a large amount of flat metal foil can be transported at one time. Consequently, it is possible to effectively cut the material costs, processing costs and transporting costs.

Figure 7:
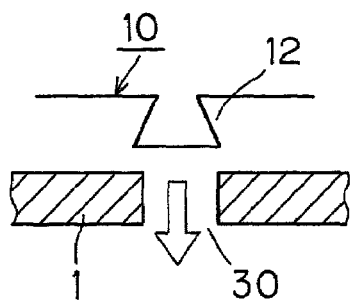
FIG. 7 is a cross-sectional view that shows another example of the connecting portion of the member of FIG. 2.

As illustrated in FIG. 7, instead of the protrusion 11 formed by rolling the edge, it is also possible to use a protrusion 12 that is formed by bending the edge into a trapezoidal cross sectional shape. This type of protrusion 12 is also easily processed by a manual job and an automatic machine job, and makes a linear contact with the hole 30.

Figure 8:
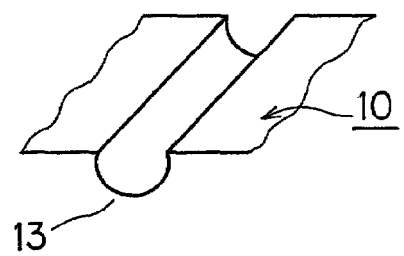
FIG. 8 is a perspective view that shows a rib of the member of FIG. 2.

Moreover, as illustrated in the development of FIG. 2 and the perspective view of FIG. 8, in the electromagnetic shield member 10, it is possible to form a groove-shaped rib 13 by a manual bending job. The formation of the rib 13 makes it possible to increase the mechanical strength of the electromagnetic shield member 10, and to apply thereto a sufficient strength to suppress the distortion thereof and maintain its fixed shape. As illustrated in FIG. 2, the rib 13 is desirably formed at an area of the electromagnetic shield member 10 that is more susceptible to deflection.

Second Preferred Embodiment

Figure 9:
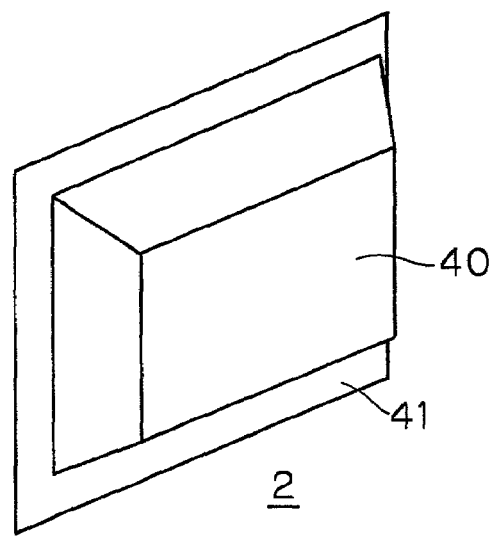
FIG. 9 is a perspective view that shows an electromagnetic shield member in accordance with a second preferred embodiment.
Figure 10:
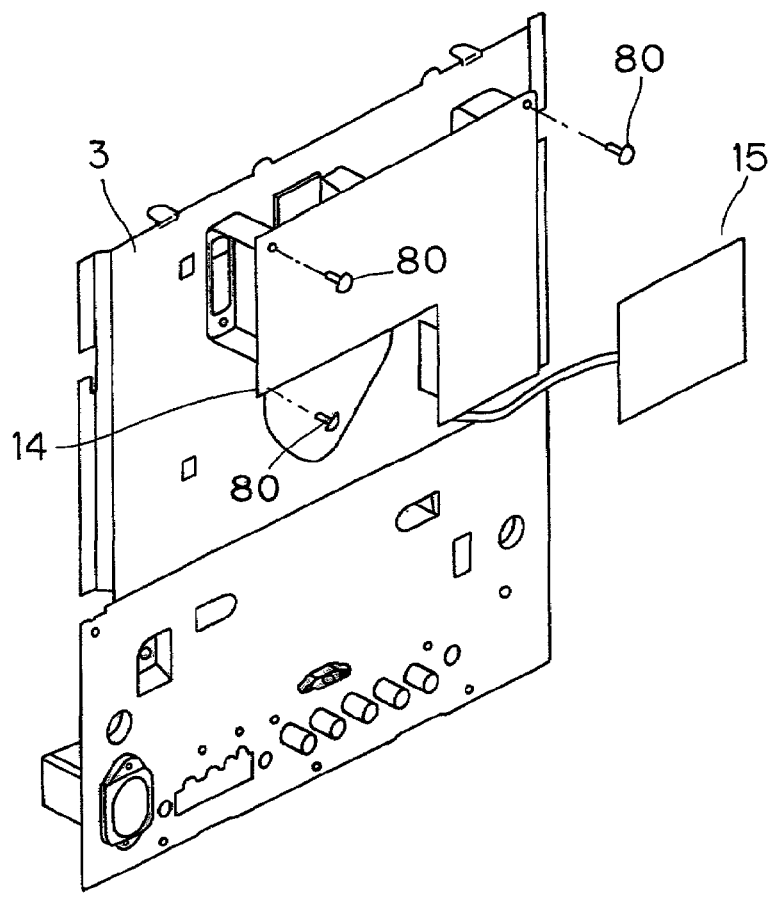
FIG. 10 is a perspective view that shows an electromagnetic shield member to which the member of FIG. 9 is connected.

FIG. 9 is a perspective view that shows an electromagnetic shield member 2 in accordance with the second preferred embodiment. Moreover, FIG. 10 is an enlarged perspective view that shows an electromagnetic shield member 3 to which this electromagnetic shield member 2 is connected. In the electromagnetic shield member 2, a recessed section 40, which is recessed toward one side of the main surfaces in the center portion thereof, is formed, and a flat flange shape portion 41 is formed on the periphery of the recessed section 40. In other words, the electromagnetic shield member 2 is formed into a box shape having a flange along the edge thereof.

This electromagnetic shield member 2 is fixed to the electromagnetic shield member 3 in such a manner that it houses a printed circuit board 14 and a CRT circuit board 15 inside the recessed section 40 and the flat portion 41 is allowed to face the main surface of the electromagnetic shield member 3. With this arrangement, the electromagnetic shielding effect for shielding electromagnetic waves radiated from the printed circuit board 14 and the CRT circuit board 15 can be sufficiently exerted. Moreover, since the electromagnetic shield member 2 has a box shape, it is possible to improve the mechanical strength of the electromagnetic shield member 2, and consequently to suppress its distortion.

Figure 11:
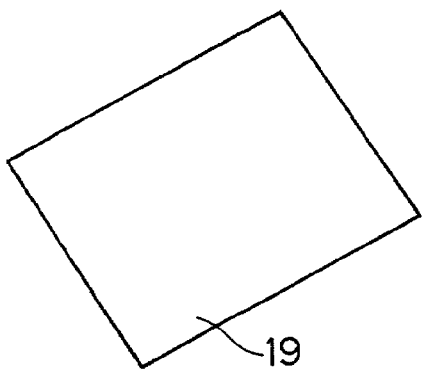
FIGS. 11 to 13 are drawings that show a processing sequence of the member of FIG. 9.
Figure 12:
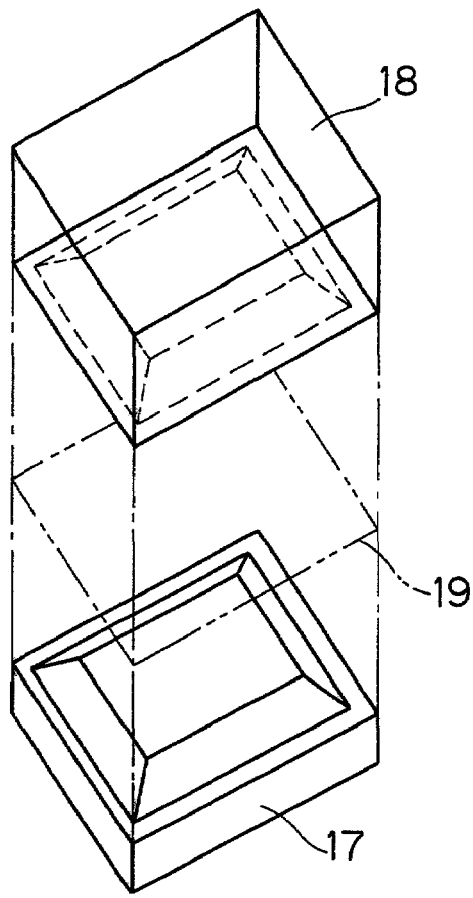
Figure 13:
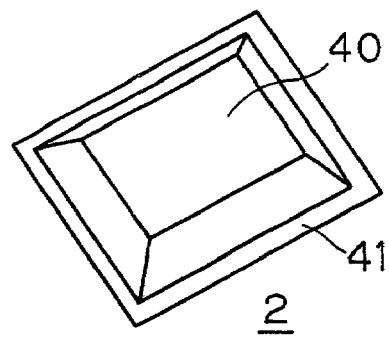

The recessed section 40 and the flat portion 41 of the electromagnetic shield member 2 can be easily formed through a drawing process. FIGS. 11 to 13 are drawings that show a sequence of the drawing processes of the electromagnetic shield member 2. To form the electromagnetic shield member 2, flat metal foils 19 before being processed are carried into an assembling site of the electronic device 100 (FIG. 11). Thereafter, a drawer having a pair of molds 17 and 18, which is placed in the assembling site, is used so as to subject the metal foil 19 to a drawing process (FIG. 12).

It is not necessary to apply a great force to carry out the drawing process on the metal foil 19; therefore, the drawer is also easily operated in a manual procedure. Moreover, although they may be made of metal, the molds 17 and 18 may also be made from wood or plastic, which is light, superior in operability, and inexpensive. As a result of the drawing process, the electromagnetic shield member 2 having the recessed section 40 and the flat portion 41 is completed (FIG. 13). In this manner, since the electromagnetic shield member 2 having a complex shape is formed through a simple manual job at an assembling site of the electronic device 100, it is possible to effectively reduce the processing costs and transporting costs for the material.

Third Preferred Embodiment

Figure 14:
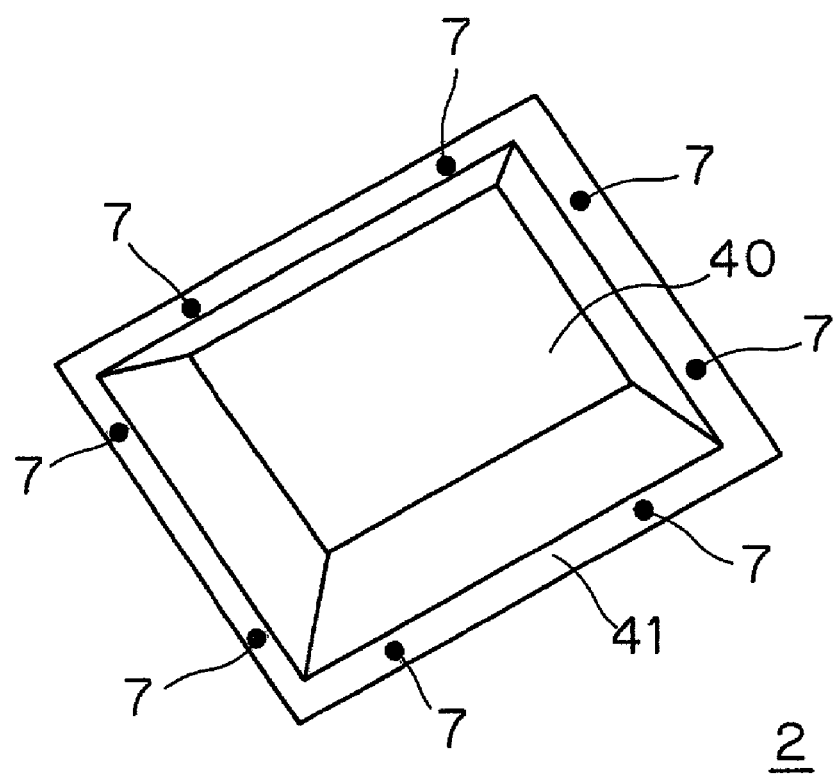
FIG. 14 is a perspective view that shows an electromagnetic shielding member in accordance with a third preferred embodiment.

FIG. 14 is a perspective view of an electromagnetic shield member 2 in accordance with the third preferred embodiment. This electromagnetic shield member 2 is characterized in that, in the electromagnetic shield member 2 shown in FIG. 9, a protrusion, not shown, is formed along the edge of the flat portion 41. At the portion 7 inside the protrusion, the electromagnetic shield member 2 is fastened onto the electromagnetic shield member 3 with screws.

Figure 15:
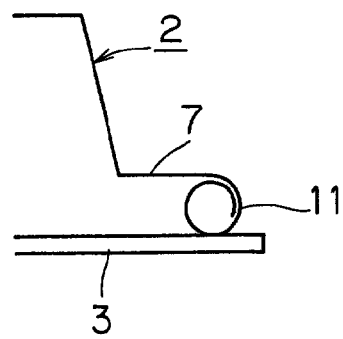
FIGS. 15 to 17 are drawings that show a sequence of connecting processes of the member of FIG. 14.
Figure 16:
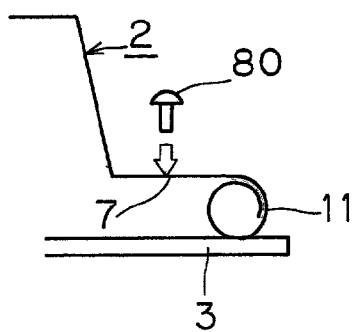
Figure 17:
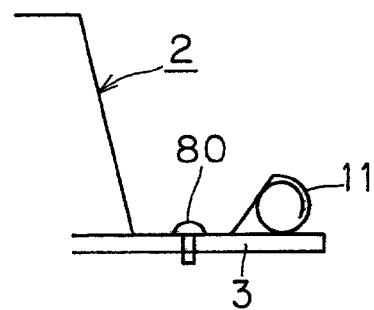

FIGS. 15 to 17 are drawings that show a sequence of processes in which the electromagnetic shield member 2 is attached to the electromagnetic shield member 3. First, the electromagnetic shield member 2 is placed on the electromagnetic shield member 3 in such a manner that the protrusion 11, formed along the edge of the flat portion 41 by using rolling process, is made in contact with the main surface of the electromagnetic shield member 3 (FIG. 15). Thereafter, a screw 80 is inserted through the portion 7 of the flat portion 41 (FIG. 16). Successively, by fastening the screw 80, the electromagnetic shield member 2 is fixed onto the electromagnetic shield member 3 (FIG. 17). Consequently, the protrusion 11 is pressed onto the main surface of the electromagnetic shield member 3 so that it is possible to make a linear contact between the electromagnetic shield members 2 and 3.

In other words, the electrical connection between the electromagnetic shield members 2 and 3 is desirably achieved not only by a point contact at the fastened portion by the screw 80, but also by the linear contact with a large width. Therefore, leakage of the electromagnetic waves is suppressed, and the effects of electromagnetic shielding are consequently improved. Moreover, it becomes possible to reduce the number of the portions 7 used for screw-fastening processes. Furthermore, the formation of the protrusion 11 along the edge of the flat portion 41 makes it possible to increase the mechanical strength of the electromagnetic shield member 2, and consequently to reduce distortion such as twisting. The protrusion 11 can be easily formed by a manual job.

Fourth Preferred Embodiment

Figure 18:
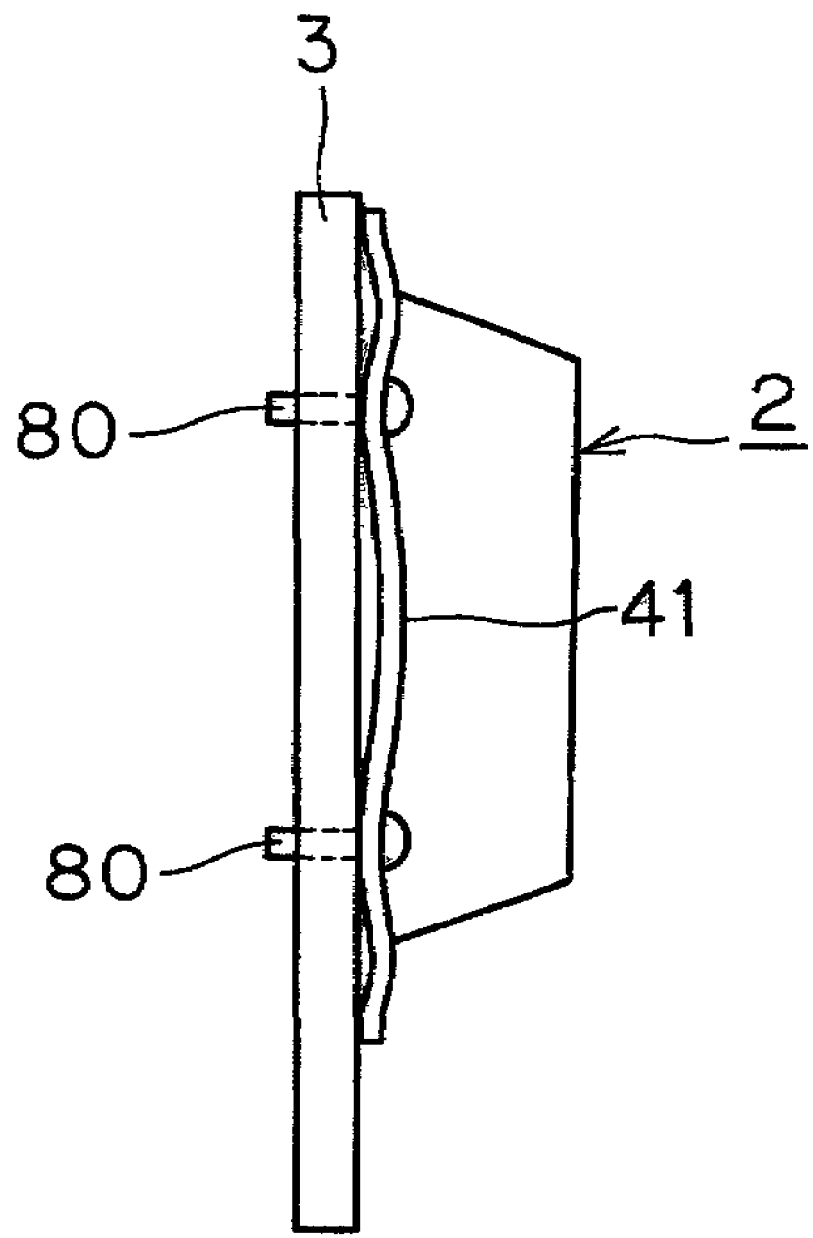
FIG. 18 is a side view that shows an electromagnetic shield member that is used in comparison with an electromagnetic shield member in accordance with a fourth preferred embodiment.

In the case when the electromagnetic shield member 2 shown in FIG. 9, is only fastened onto the electromagnetic shield member 3 with the screw 80, as shown in FIG. 18, a distortion occurs at a portion away from the portion fastened by the screw 80 in the flat portion 41, with the result that the electrical connection between the electromagnetic shield members 2 and 3 might deteriorate. The protrusion 11 of the third preferred embodiment is one of the effective means for reducing this defect; however, in the present preferred embodiment, another means is adopted.

Figure 19:
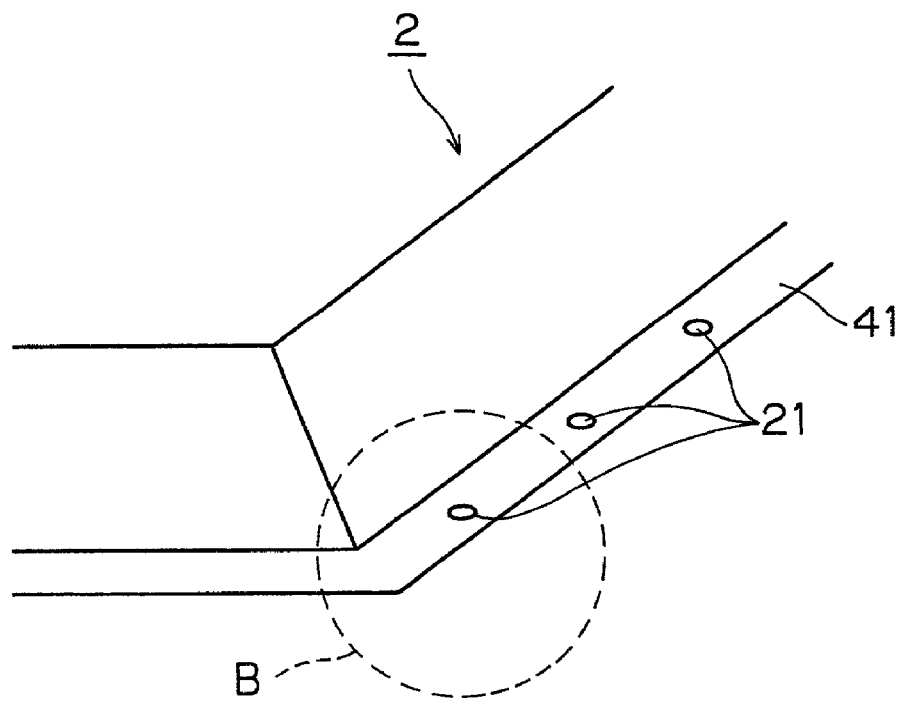
FIG. 19 is a partial perspective view of the electromagnetic shield member in accordance with the fourth preferred embodiment.
Figure 20:
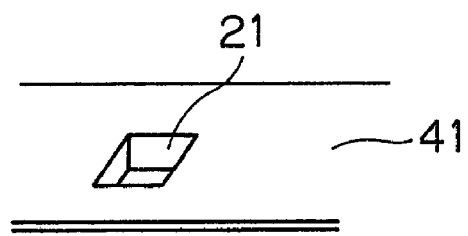
FIG. 20 is an enlarged view that shows a portion surrounded by a circle B in FIG. 19.

FIG. 19 is a partial perspective view of an electromagnetic shield member 2 in accordance with the fourth preferred embodiment, and FIG. 20 is a partial enlarged view that shows a portion surrounded by a circle B in FIG. 19 in an enlarged manner. In the electromagnetic shield member 2 of the present preferred embodiment, protrusions 21 are formed on the flat portion 41. The protrusions 21 are formed in such a manner as to be aligned along the edge of the flat portion 41, and these are also formed by a drawing process. The drawing process is easily carried out by manually operating a simple drawer at an assembling site of the electronic device 100.

Figure 21:
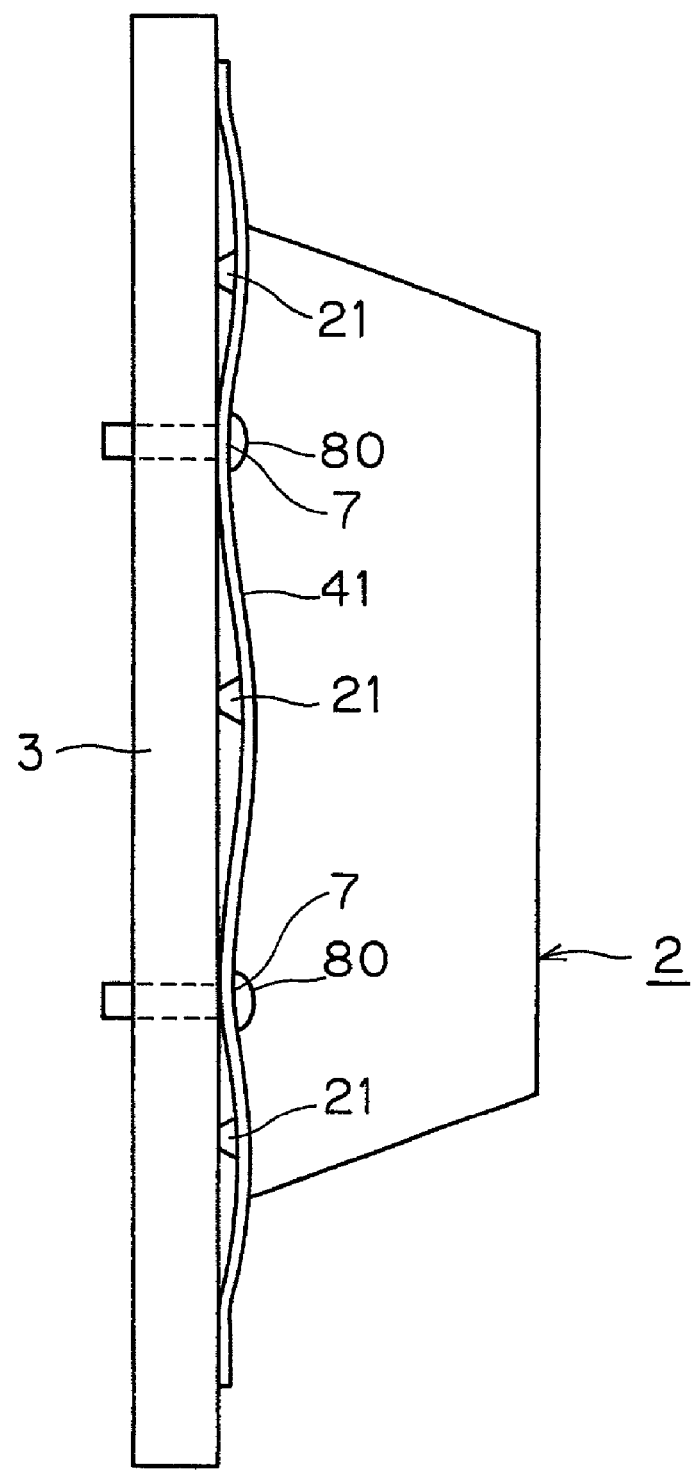
FIG. 21 is a side view that shows the member of FIG. 19 and a member connected thereto.

As illustrated in FIG. 21, the electromagnetic shield member 2 having the protrusions 21 is fixed to the electromagnetic shield member 3 with screws 80 at portions 7 of the flat portion 41. The portions 7 and the protrusions 21 are so positioned as to be alternately aligned with each other. As a result, since the protrusions 21 are pressed onto the main surface of the electromagnetic shield member 3, so the gap between the electromagnetic shield members 2 and 3 is electrically connected through the protrusions 21 together with the portions 7. In other words, a desirable electric connection is achieved between the two members, thereby making it possible to improve the electromagnetic shielding effect.

Fifth Preferred Embodiment

Figure 22:
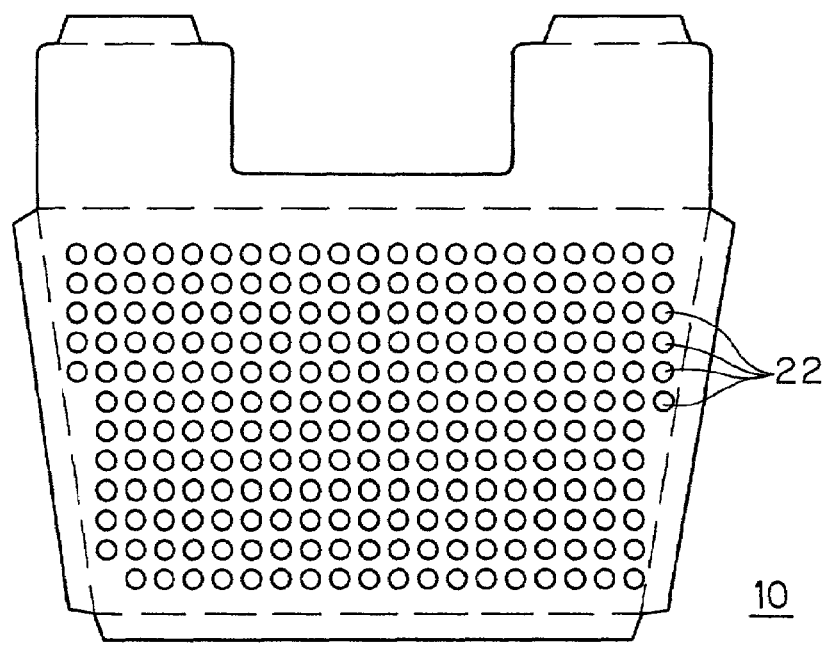
FIG. 22 is a development that shows an electromagnetic shield member in accordance with a fifth preferred embodiment.

FIG. 22 is a development that shows an electromagnetic shield member 10 in accordance with the fifth preferred embodiment. In this electromagnetic shield member 10, holes 22 are formed in such a manner that they are two-dimensionally arranged. The holes 22 function as air holes through which heat generated by the circuits covered with the electromagnetic shield 10 is released.

Figure 23:
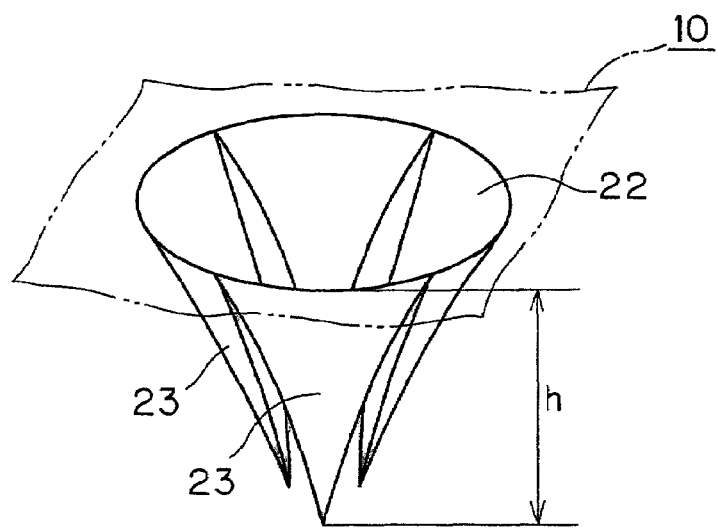
FIG. 23 is a perspective view that shows one portion of the member of 22 in an enlarged manner.
Figure 24:
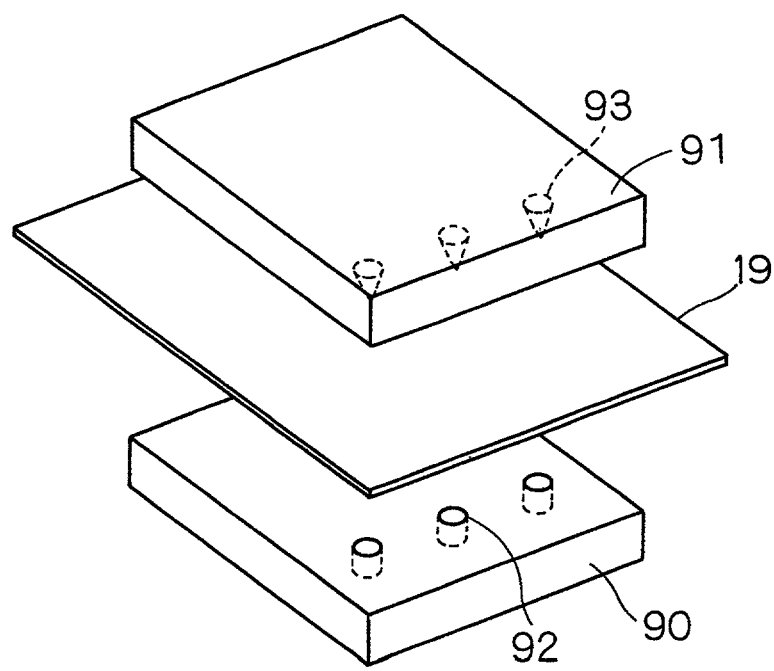
FIG. 24 is a drawing that shows a processing sequence of the member of FIG. 22.
Figure 25:
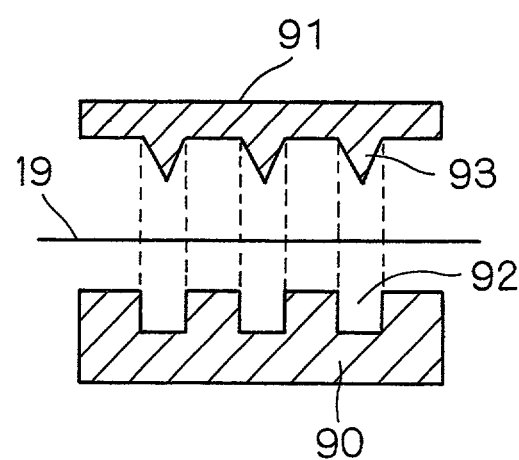
FIG. 25 is a cross-sectional view that shows a mold used in the processes of FIG. 24.

FIG. 23 is a perspective view that shows a three-dimensional shape of the electromagnetic shield member 10 at the portion of the hole 22. As illustrated in FIG. 23, the hole 22 is formed by a hand push cutter, and burr portions 23 generated by the hand push cutter are not removed. FIG. 24 is a drawing that shows a sequence of processes in which the holes 22 are formed. By using a pair of molds 90 and 91 serving as the hand push cutter, metal foil 19, used as the material for the electromagnetic shield member 10, is subjected to a push-cutting process. As illustrated in the cross-sectional view of FIG. 25, holes 92 are formed in the mold 90 and protrusions 93 are formed on the mold 91 at positions corresponding to the holes 92. Since it is not necessary to apply a great force to the metal foil 19 in the push-cutting process, the holes 22 are easily formed by manually applying a pressing force onto the pair of molds 90 and 91 at an assembling site of the electronic device 100. Moreover, although the molds 91 and 92 may be made of metal, they may be made of wood or plastic, which is light, superior in operability and inexpensive. Different from the conventional electromagnetic shield member 10 using a metal plate, it is not necessary to remove the burr portions 23; therefore, this also makes it possible to improve the operability, and to cut the processing costs.

Figure 26:
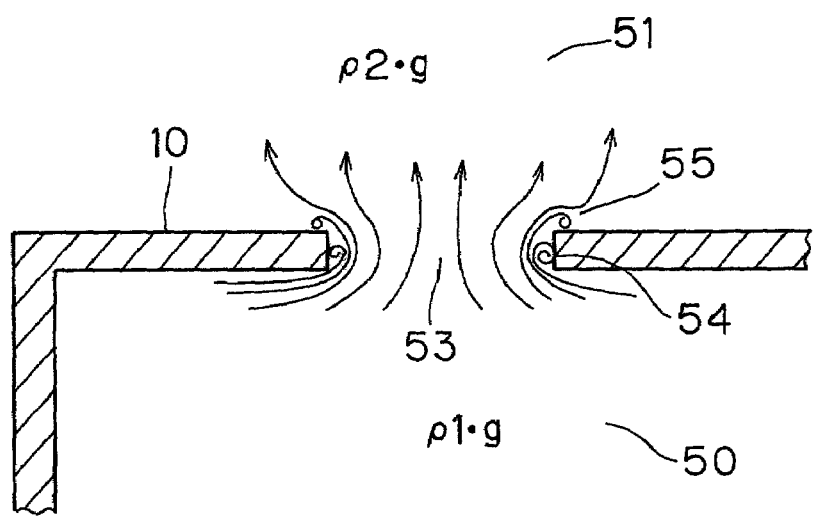
FIGS. 26 and 27 are explanatory drawings that show the effects of the member of FIG. 22.
Figure 27:
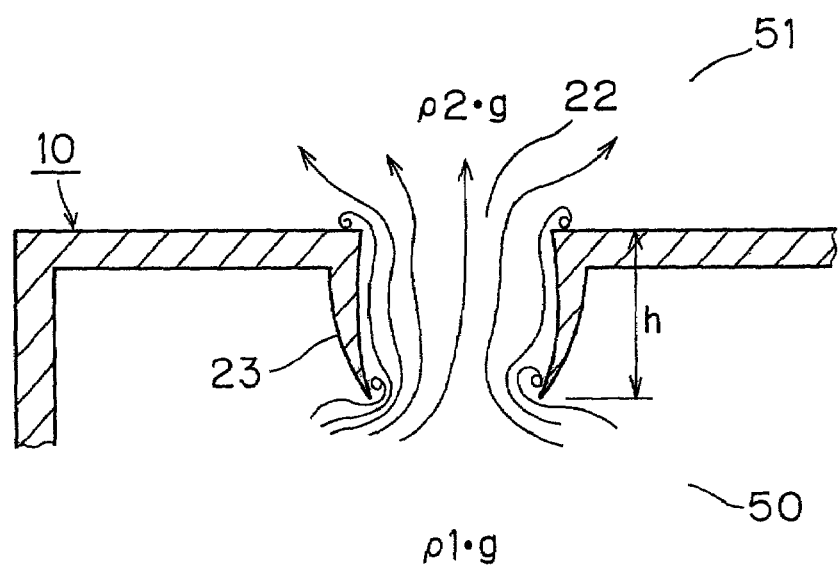

The burr portions 23 need not be removed, and the remaining burr portions are also allowed to exert a positive effect, that is, improved air permeability. FIGS. 26 and 27 are explanatory drawings that show a mechanism in which the bur portions 23 provide improved air permeability. As illustrated in FIG. 26, in the case of the conventional electromagnetic shield member 10 that is made of metal without the burr portions 23 thereon, there is a difference between the weight density $\rho 2 \cdot g$ of air 51 outside a hole 53 and the weight density $\rho 1 \cdot g$ of air 50 inside the hole 53 due to a temperature difference. Here, g represents gravitational acceleration, and $\rho$ represents mass density. Consequently, a buoyancy is exerted in the air 50 inside so that air 50 located inner side is directed outside through the hole 53, resulting in a convection.

The buoyancy Pf is generally represented by Pf= $(\rho 1 \cdot g - \rho 2 \cdot g) \cdot H$. Here, H represents a distance in the height direction of an area in which the temperature is regarded to be uniform. In FIG. 26, the distance H approximately corresponds to the thickness of the metal plate. Moreover, in FIG. 26, in the vicinity of the edge of the hole 53, there are a portion 54 that has a pressure loss due to the passage of the air flow that is abruptly narrowed and a portion 55 that has a pressure loss due to the passage of the air flow that is abruptly widened.

In contrast, as illustrated in FIG. 27, in the case of the electromagnetic shield member 10 having the burr portions 23, the distance H corresponds to the length h of the burr portion 23. In comparison with the configuration of FIG. 26, the buoyancy Pf becomes greater in that of FIG. 27. Moreover, in comparison with the configuration of FIG. 26, the pressure loss becomes smaller in that of FIG. 27. Consequently, it is possible to effectively improve the air permeability in the electromagnetic shield member 10 having the burr portions 23.

Sixth Preferred Embodiment

Figure 28:
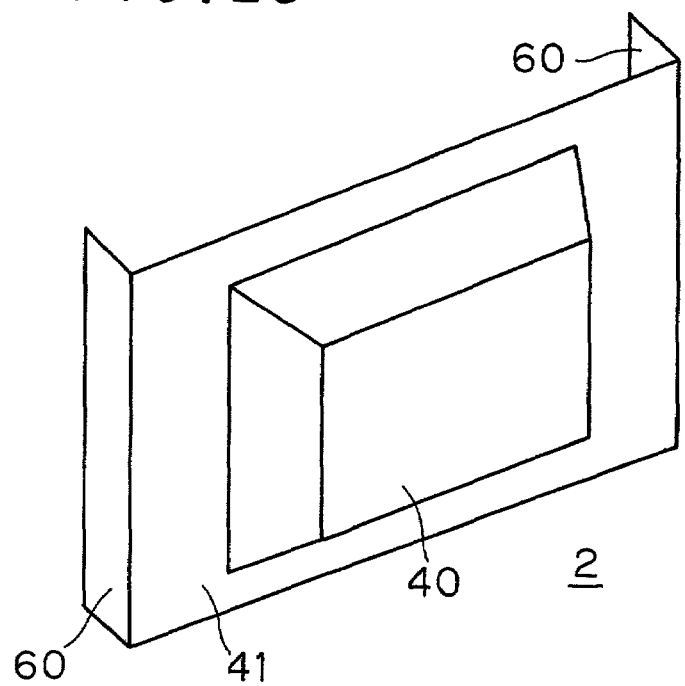
FIG. 28 is a perspective view that shows an electromagnetic shield member in accordance with a sixth preferred embodiment.
Figure 29:
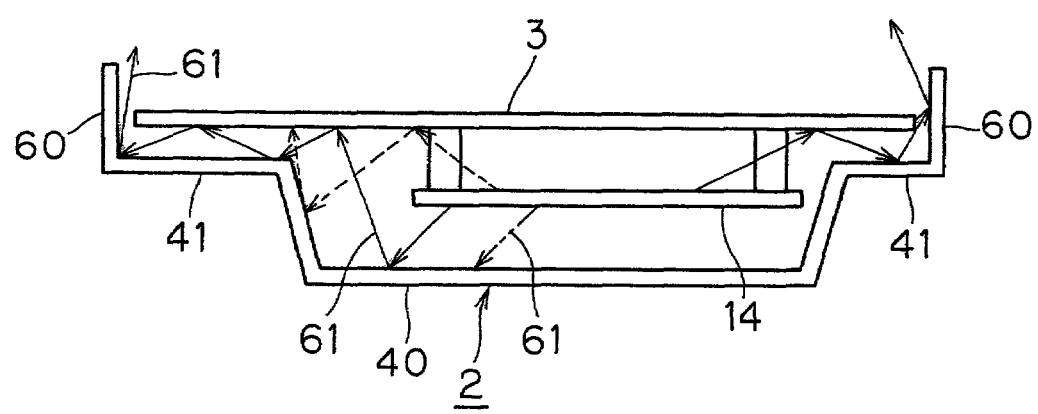
FIG. 29 is a cross-sectional view that shows the member of FIG. 28 after the connection.

FIG. 28 is a perspective view of an electromagnetic shield member 2 in accordance with the sixth preferred embodiment. This electromagnetic shield member 2 is characterized in that, in the electromagnetic shield member 2 shown in FIG. 9, an upright portion 60 that stands upright with respect to the flat portion 41 is formed along the edge thereof by bending the flat portion 41. FIG. 29 shows a cross-sectional view that shows the mutually connected electromagnetic shield members 2 and 3. The flat portion 41 is allowed to directly face the main surface of the electromagnetic shield member 3, and the upright portion 60 is allowed to directly face the edge of the electromagnetic shield member 3. In other words, the flat portion 41 and the upright portion 60 cooperatively cover the edge and the portion of the main surface adjacent to the edge of the electromagnetic shield member 3.

Therefore, electromagnetic waves 61, generated in the printed circuit board 14, are forced to pass through a narrow, long passage sandwiched by the electromagnetic shield member 3 and the flat portion 41 as well as the upright portion 60, while accumulating reflection losses due to multiplex scattering. For this reason, it is possible to further improve the electromagnetic shielding effect. Here, the reflection loss refers to a phenomenon in which reflections occur when the electromagnetic waves 61 are made incident on a conductive material, such as the metal foil or the metal plate, from air, while the intensity of the electromagnetic waves is decaying due to the reflections.

Since metal foil that is inexpensive and easily processed is used as the electromagnetic shield member 2, it is possible to reduce the costs in comparison with the conventional electromagnetic shield member 2 using the metal plate, even when the flat portion 41 and the upright portion 60 useless for housing of the printed circuit board 14 are formed. With respect to numerical examples for aluminum, the metal foil having a thickness of 80 μm makes it possible to reduce the material cost to approximately ⅙ of a metal plate having a thickness of 0.5 mm.

Seventh Preferred Embodiment

FIGS. 30 to 35 are cross-sectional views or perspective views that show various structures of the connecting portion between the electromagnetic shield members 2 and 10 in accordance with the present preferred embodiment. In any of these examples, taking advantage of the feature that both of the electromagnetic shield members 2 and 10 are made of metal foil, the connecting process is carried out by a simple manual job.

Figure 30:
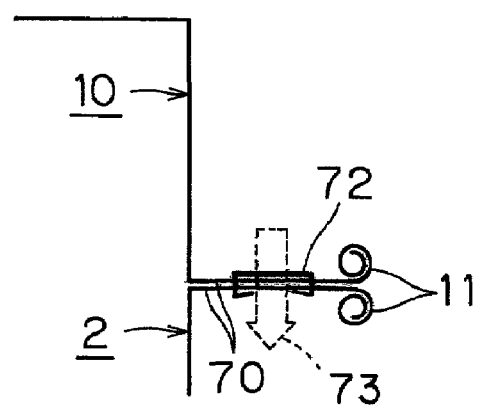
FIGS. 30 to 35 are cross-sectional views that show a connecting portion between metal foils in accordance with a seventh preferred embodiment.
Figure 31:
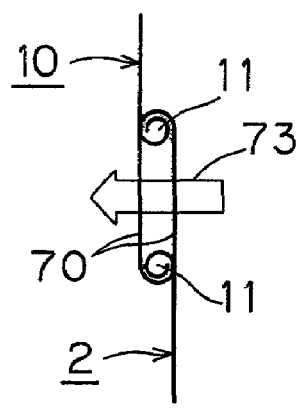

In the examples of FIGS. 30 and 31, the electromagnetic shield members 2 and 10 are laminated on each other at respective connecting portions 70, and fixed to each other with stapler pins 72. Arrow 73 indicates the applying direction of the stapler. Moreover, a protrusion 11 is formed on each of the electromagnetic shield members 2 and 10 by rolling the edge thereof adjacent to the connecting portion 70. In FIG. 30, the protrusions 11 are formed so as to stick outwards (that is, in departing directions from each other), and in FIG. 31, they are formed so as to stick inwards (that is, in approaching directions with each other). Since the protrusion 11 makes it possible to reduce distortion of the connecting portion 70, it is possible to desirably achieve the electrical connection between the electromagnetic shield members 2 and 10, and consequently to improve the electromagnetic shielding effect. In particular, in the example of FIG. 31, the protrusion 11 is pressed so that the linear contact made by the protrusion 11 is added to the contact between the electromagnetic shield members 2 and 10; therefore, the electrical connection between the two members is more desirably achieved.

Figure 32:
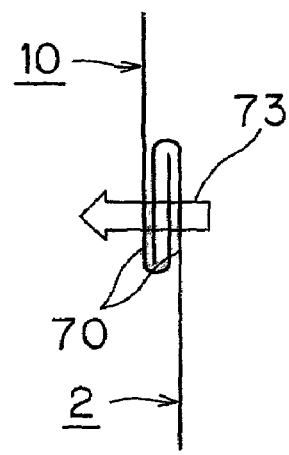
Figure 33:
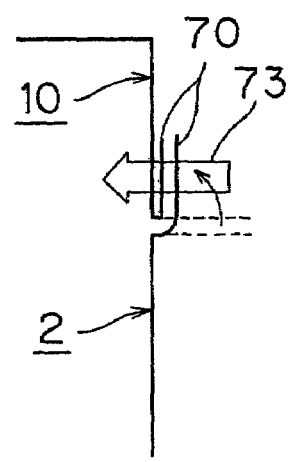

In the examples of FIGS. 32 and 33, at the respective connecting portions 70, the electromagnetic shield members 2 and 10 are overlapped on each other by bending processes into a triple or more overlapped structure with each other, and are fixed by stapler pins 72 to each other. This triple or more overlapped structure makes it possible to desirably achieve a face-to-face contact between the two members. Consequently, it is possible to further achieve the electromagnetic shielding effect.

Figure 34:
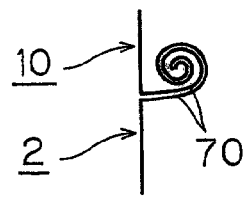

In the example of FIG. 34, the electromagnetic shield members 2 and 10 are laminated on each other at the respective connecting portions 70, and rolled up in the laminated state. Therefore, it is possible to desirably achieve a face-to-face contact between the two members, and consequently to further improve the electromagnetic shielding effect.

Figure 35:
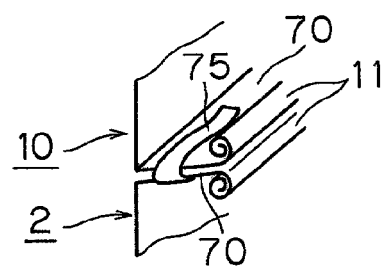

In the example of FIG. 35, the electromagnetic shield members 2 and 10 are laminated on each other at the respective connecting portions 70, and fixed to each other by being sandwiched by a clip 75. The clip 75 is made of, for example, metal plates or plastic. Moreover, a protrusion 11 is formed on each of the electromagnetic shield members 2 and 10 by rolling the edge thereof adjacent to the connecting portion 70. Since the protrusion 11 makes it possible to reduce distortion of the connecting portion 70, it is possible to desirably achieve the electrical connection between the electromagnetic shield members 2 and 10, and consequently to improve the electromagnetic shielding effect. FIG. 35 shows an example in which, in the example of FIG. 30, the stapler pin 72 is replaced by the clip 75. In the same manner, in any of the cases of FIGS. 31 to 33, the stapler pin 72 may be replaced by the clip 75.

In examples shown in FIGS. 30 to 35, different from the connection between metal plates, these connecting processes make it possible to eliminate molds, welding processes, riveting and caulking processes, and screw-fastening processes, etc., required for processing metal plates, and consequently to reduce not only the material costs, but also the processing costs greatly.

Eighth Preferred Embodiment

Figure 36:
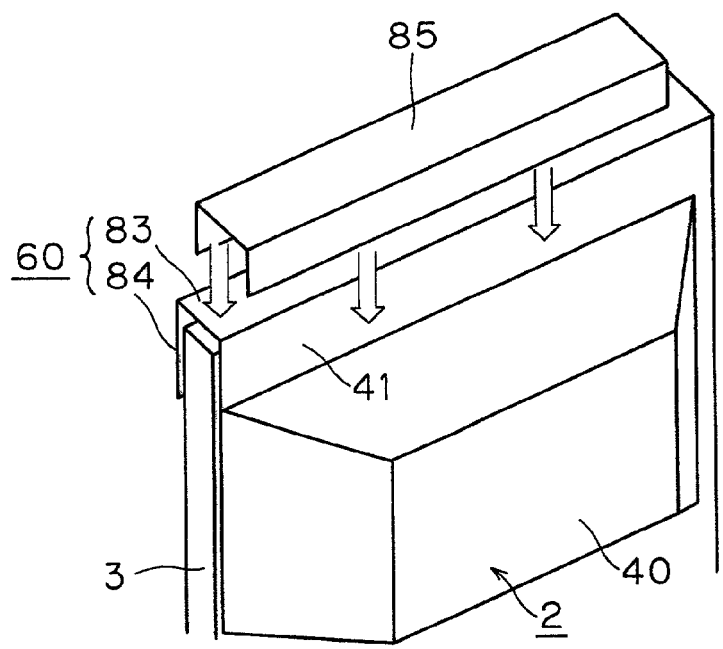
FIG. 36 is a cross-sectional view that shows a connecting portion between a metal foil and a metal plate in accordance with an eighth preferred embodiment.
Figure 37:
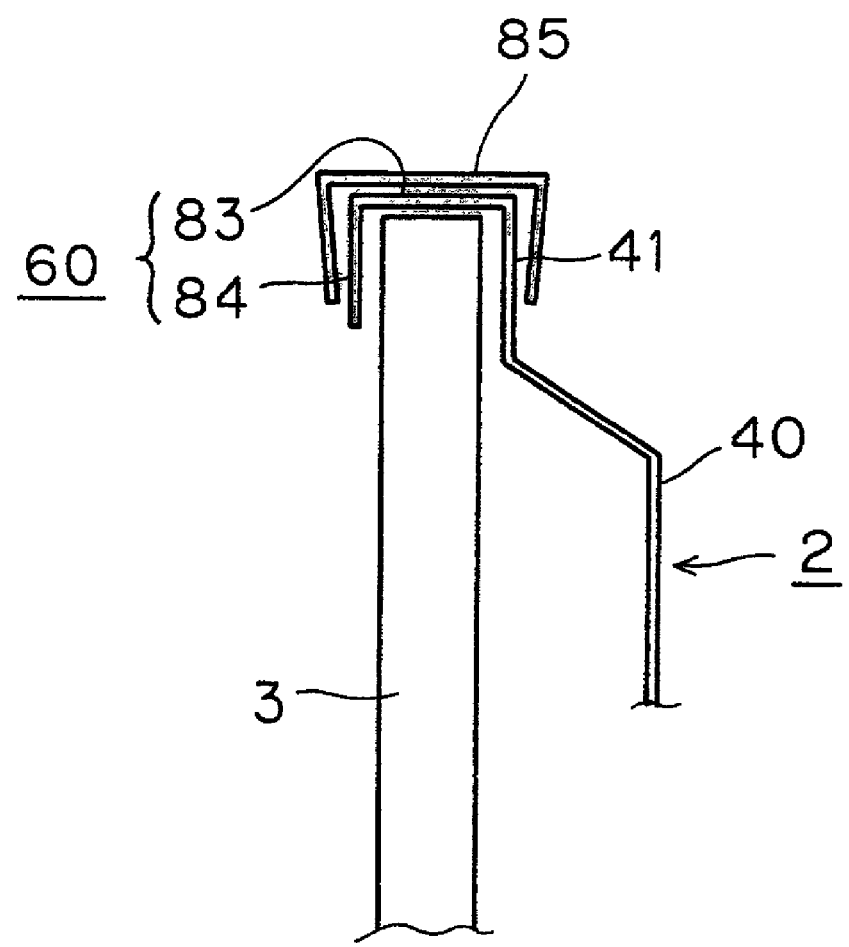
FIG. 37 is a perspective view that shows the connecting portion between a metal foil and a metal plate in accordance with the eighth preferred embodiment.

FIGS. 36 and 37 are perspective and cross-sectional views that respectively show a connecting portion between electromagnetic shield members 2 and 3 in accordance with the eighth preferred embodiment. This electromagnetic shield member 2 has an arrangement in which, in the electromagnetic shield member 2 of FIG. 9, extending portions 83 and 84 are further added to the flat portion 41. The extending portion 83 is bent from the flat portion 41, and the extending portion 84 is further bent from the extending portion 83. The extending portions 83 and 84 correspond to portions that are formed by bending the upright portion 60 of FIG. 28.

The extending portion 83 covers the edge of the electromagnetic shield member 3, and the extending portion 84 and the flat portion 41 cover areas adjacent to the edge in the pair of main surfaces of the electromagnetic shield member 3. These areas are sandwiched by a groove formed in a frame member 85 having a U-letter shape in its cross-section together with the extending portion 84 and the flat portion 41 so that the electromagnetic shield members 2 and 3 are fixed to each other. The frame member 85 is made of, for example, a metal plate or plastic, and allowed to sandwich the electromagnetic shield members 2 and 3 by its elastic restoring force. Therefore, the fixing process of the electromagnetic shield members 2 and 3 by the use of the frame member 85 is easily carried out by a manual job.

In the conventional electronic device 150 where the electromagnetic shield member 2 is made of a metal plate similarly to the electromagnetic shield member 3, the electromagnetic shield member 2 lacks flexibility that is required for its bending process, and even if the bending process were carried out, there would be dispersion in the precision, with the result that even the pressing force of the frame member 85 might fail to provide a desirable electrical connection. Moreover, since a high strength is required for the frame member 85, it is difficult to simply carry out the attaching process of the frame member 85 by a manual job. In other words, in the present preferred embodiment, by taking advantage of the electromagnetic shield member 2 being made of metal foil, the connection between the electromagnetic shield members 2 and 3 is carried out more easily at low costs.

While the invention has been shown and described in detail, the foregoing description is in all aspects illustrative and not restrictive. It is therefore understood that numerous other modifications and variations can be devised without departing from the scope of the invention.

What is claimed is:

1. An electronic device which comprises an electromagnetic shield, said electromagnetic shield comprising:
   a metal foil and a metal plate that are connected to each other,
   wherein at a connecting portion of said metal foil and said metal plate, a protrusion, formed by deforming said metal foil along an edge of said metal foil, is fitted into a hole formed along an edge of said metal plate, said metal foil and said metal plate are fastened to each other with a screw at said connecting portion.

2. The electronic device according to claim 1, wherein said protrusion is formed by rolling up said edge of said metal foil.

3. The electronic device according to claim 1, wherein said protrusion is formed by bending said edge of said metal foil.

4. The electronic device according to claim 1, wherein said metal foil comprising:
   a rib formed by bending.

5. The electronic device according to claim 1, wherein said metal foil comprises a hole that is formed by a hand push cutter, with a burr portion being left on a periphery thereof.

6. An electronic device which comprises an electromagnetic shield, said electromagnetic shield comprising:
   a metal foil and a metal plate that are connected to each other,
   wherein, at a connecting portion of said metal foil and said metal plate, a protrusion, formed by deforming said metal foil, is formed on said metal foil, and at a position apart from said protrusion in said connecting portion, said metal foil and said metal plate are fastened to each other with a screw so that said protrusion is toward said plate, wherein said protrusion is formed by rolling up said edge of said metal foil.

7. The electronic device according to claim 6, wherein said protrusion is formed by subjecting said metal foil to a drawing process.

8. The electronic device according to claim 6, said metal foil comprising:
   a rib formed by bending.

9. The electronic device according to claim 6, wherein said metal foil comprises a hole that is formed by a hand push cutter, with a burr portion being left on a periphery thereof.

10. An electronic device which comprises an electromagnetic shield, said electromagnetic shield comprising:
    a metal foil and a metal plate that are connected to each other,
    wherein, at a connecting portion of said metal foil and said metal plate, a protrusion, formed by deforming said metal foil, is formed on said metal foil, and at a position apart from said protrusion in said connecting portion, said metal foil and said metal plate are fastened to each other with a screw so that said protrusion is toward said metal plate,
    wherein said metal plate includes a hole for receiving said protrusion and wherein said protrusion is pressed into said hole.

* * * * *